(12) United States Patent
Honer et al.

(10) Patent No.: US 6,830,990 B1
(45) Date of Patent: Dec. 14, 2004

(54) METHOD AND APPARATUS FOR DICING RELEASED MEMS WAFERS

(75) Inventors: Kenneth Honer, Santa Clara, CA (US); Aaron Parker, Campbell, CA (US); Daniel G. Parker, Palo Alto, CA (US)

(73) Assignee: LightConnect, Inc., Newark, CA (US)

( * ) Notice: Subject to any disclaimer, the term of this patent is extended or adjusted under 35 U.S.C. 154(b) by 216 days.

(21) Appl. No.: 10/214,918

(22) Filed: Aug. 7, 2002

Related U.S. Application Data

(63) Continuation of application No. 10/191,095, filed on Jul. 8, 2002.
(60) Provisional application No. 60/303,733, filed on Jul. 6, 2001.

(51) Int. Cl.[7] .................. H01L 21/301; H01L 21/46; H01L 21/78
(52) U.S. Cl. ........................ 438/460; 438/462
(58) Field of Search ................. 438/460, 462, 438/113, 33, 68, 458

(56) References Cited

U.S. PATENT DOCUMENTS 6,121,118 A  *  9/2000  Jin et al. .................. 438/460

* cited by examiner

*Primary Examiner*—Richard Elms
*Assistant Examiner*—Beth E. Owens
(74) *Attorney, Agent, or Firm*—James E. Eakin

(57) ABSTRACT

Various embodiments are methods and apparatuses for different steps in separating wafers into multiple wafer die. Some embodiments are adapted for dicing wafers having a front side and a back side, where the front side has processed devices, such as MEMS devices.

9 Claims, 8 Drawing Sheets

METHOD AND APPARATUS FOR DICING RELEASED MEMS WAFERS

CROSS REFERENCE TO RELATED APPLICATIONS

This application incorporates by reference is a continuation and claims the benefit of priority from U.S. application Ser. No. 10/191,095, filed Jul. 8, 2002, now abandoned, which claims the benefit of priority of from provisional U.S. Application Ser. No. 60/303,733, filed Jul. 6, 2001. applications are fully incorporated herein by reference.

BACKGROUND OF THE INVENTION

1. Field of the Invention

The field relates generally to separation of a wafer into a plurality of die, and in particular relates to separation of a wafer into a plurality of die where the die have thereon surface critical devices, such as the structures for microelectromechanical systems.

2. Description of the Related Art

Microelectromechanical systems (MEMS) in some instances are fabricated using relatively standard wafer fabrication techniques. In such processing, a plurality of die are fabricated from each wafer, and the wafer must, at or near the end of the fabrication process, be separated into a plurality of the die comprising the MEMS device.

However, the MEMS structures created on the die can be quite fragile in comparison with other types of circuits and devices fabricated using similar techniques. In particular, in a number of MEMS devices, part of the fabrication process is to create a plurality of thin metallized ribbons (or functionally similar shapes) above the substrate of the wafer. The ribbons are initially fabricated by depositing metal (usually, though not necessarily aluminum) on a sacrificial layer of silicon that is deposited on a substrate. After the ribbons are defined by the metal deposition steps, the sacrificial layer of silicon is removed by an etching process, leaving the ribbons free "released" so that they can move toward the substrate by the application of a voltage potential between the ribbon and the substrate.

Following the completion of processing, the wafer, which typically contains as many as several hundred individual devices, must be separated into the individual die. In conventional semiconductor processing, this is accomplished by a dicing saw, where the saw is aligned with the wafer from the top and the wafer is then cut. In conventional dicing, a digital camera can image location indicators on the front side of the wafer. These location indicators can be etched in the same layers used to create the devices. The location indicators are typically used to line up the saw blade by adjusting the position and rotation of the wafer on the dicing chuck of the saw. A water bath is typically applied to keep the saw and wafer cool, such that water and silica dust are allowed to coat the surface of the device.

However, such processing techniques would yield only disaster for certain types of MEMS devices, because water and silica dust are major contaminants which can prohibit the proper deflection of the ribbons as well as other problems. Certain MEMS devices present unusual dicing issues because, once the ribbons have been released, they become particularly fragile and susceptible to contamination. In addition, no photoresist or other protective layer can be placed over the MEMS structures (e.g., the ribbons) during the dicing process, unlike more conventional semiconductor devices.

A vacuum chuck is typically used to hold the wafer during dicing. A conventional dicing chuck uses concentric vacuum rings to secure the wafer to the chuck. In such an arrangement, water can wick underneath the wafer, even across the entire surface, which can introduce capillary forces that draw water into the space between the ribbons and the substrate. Removing the water from the devices can be difficult even after the vacuum has been turned off.

As a result, new devices, methods and techniques must be developed to ensure that the MEMS devices located on the surface of the wafer are not damaged while separating the wafer into die.

SUMMARY OF THE INVENTION

The present invention teaches devices and techniques for separating a wafer on which MEMS devices have been fabricated into the die containing those devices. In particular, the present invention can include the following general steps. First, an alignment jig is developed so that the backside of the wafer can be aligned with the devices located on the upper or active front side of the wafer. Then, the active area of the wafer is placed against the chuck of the dicing saw; in some embodiments a series of pillars or stand-offs may be provided to allow the wafer to be mounted to the chuck at a height greater than the height of the MEMS structures. The alignment jig permits the wafer to be aligned in a manner similar to conventional front side alignment, but entirely from the back. The back of the wafer is then, in at least some embodiments, scribed to establish alignment marks.

Next, the wafer is saw is used from the back side to cut or dice part way through the wafer along the rows and columns which define the various die. By cutting only part way through, the presence of silica dust and water is minimized on the active surface of the wafer. A special vacuum chuck arrangement may be provided to seal the front surface of the wafer against water and silica dust, including the use of a sealing material which may be provided at the outer edge of the wafer to further prevent unwanted contamination of the active area of the front of the wafer. The backside of the wafer is then cleaned after the partial saw cuts are made.

Next, a layer of stretchable material, for example a stretchable tape, is applied to the backside of the wafer so that each of the die adheres to the tape. The tape is then stretched, causing the wafer to separate along the various partial saw cuts made from the back side of the wafer, which define the individual die. The die are then removed from the tape, which may be accomplished in at least some embodiments by exposing the tape to ultraviolet light.

These and other details may be better appreciated from the following Detailed Description of the Invention, taken in light of the accompanying Figures.

DETAILED DESCRIPTION OF THE INVENTION

Figure 1:
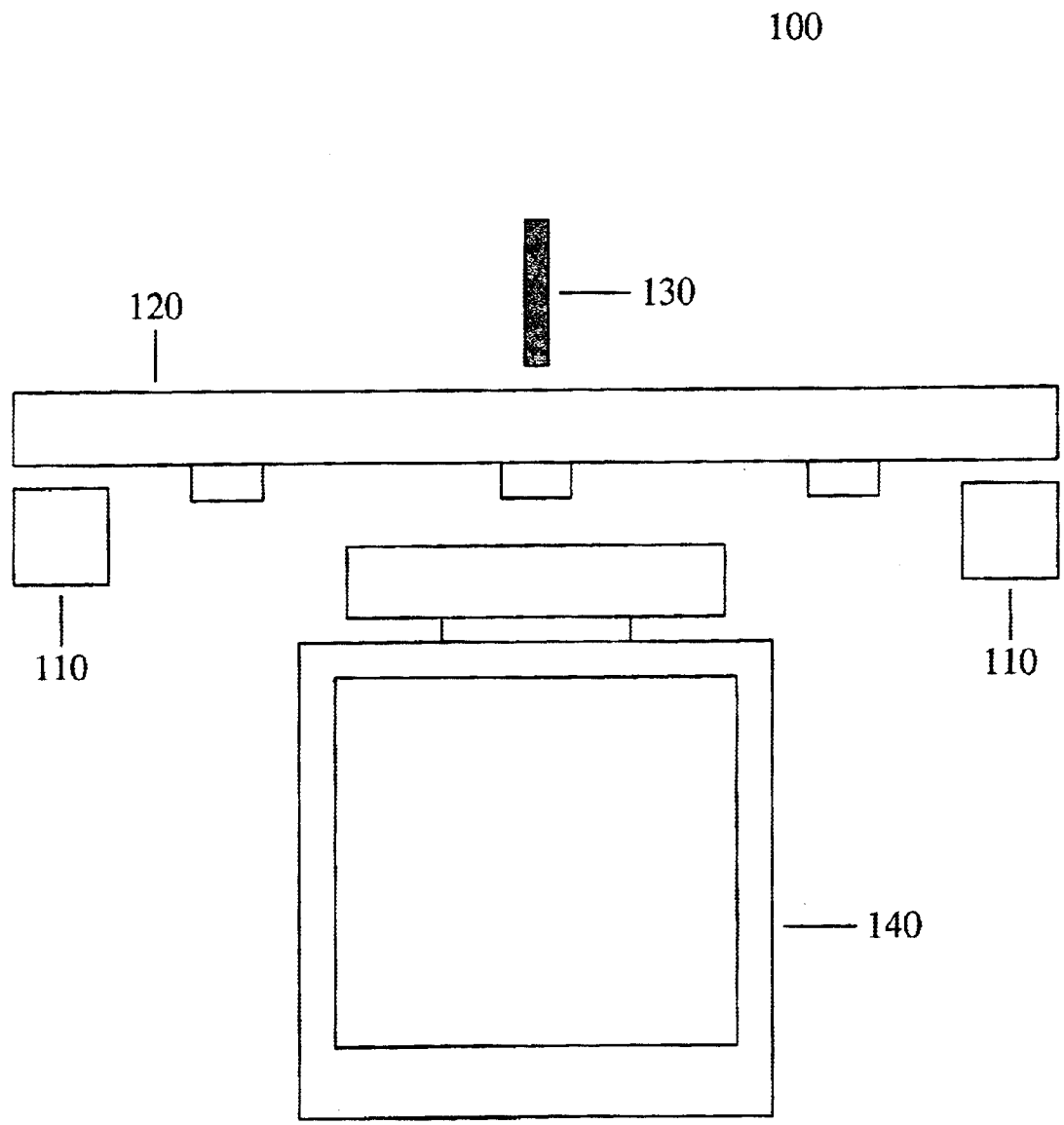
FIG. 1 shows an overall view of schematic of one embodiment of an alignment system for handling wafers in accordance with the present invention.

Referring first to FIG. 1, a schematic of one embodiment of an alignment system 100 is shown for aligning a wafer with a dicing saw from the back side. A base or chuck 110 supports a wafer 120 with the active surface of the wafer 120 against the chuck. In some embodiments, although not required for all, a plurality of stand-offs or pillars 125 may be used to ensure that the wafer is mounted on the chuck at a height greater than the height of the MEMS structures. A marker 130 is positioned above the back side of the wafer 120. A detector 140, which may be a video camera suitable for visual inspection and alignment of the wafer, is positioned to detect the relative position between the marker 130 the wafer 120.

The marker 130 may be a scribe or saw, and is arranged to cooperate with the detector 140 or camera for alignment of the backside of the wafer in a manner similar to conventional, front side alignment. Thus, the devices on the front side of the wafer should be aligned with the marking device facing the back side of the wafer. To achieve appropriate alignment, either the wafer or the marker, or both, may be moved relative to one another. Once alignment is achieved, typically with reference to a boundary between processed devices on the front side, location indicators can be marked on the back side of the wafer 120. In some embodiments, alignment may be accomplished with visible light, infrared, or other wavelengths.

Figure 2:
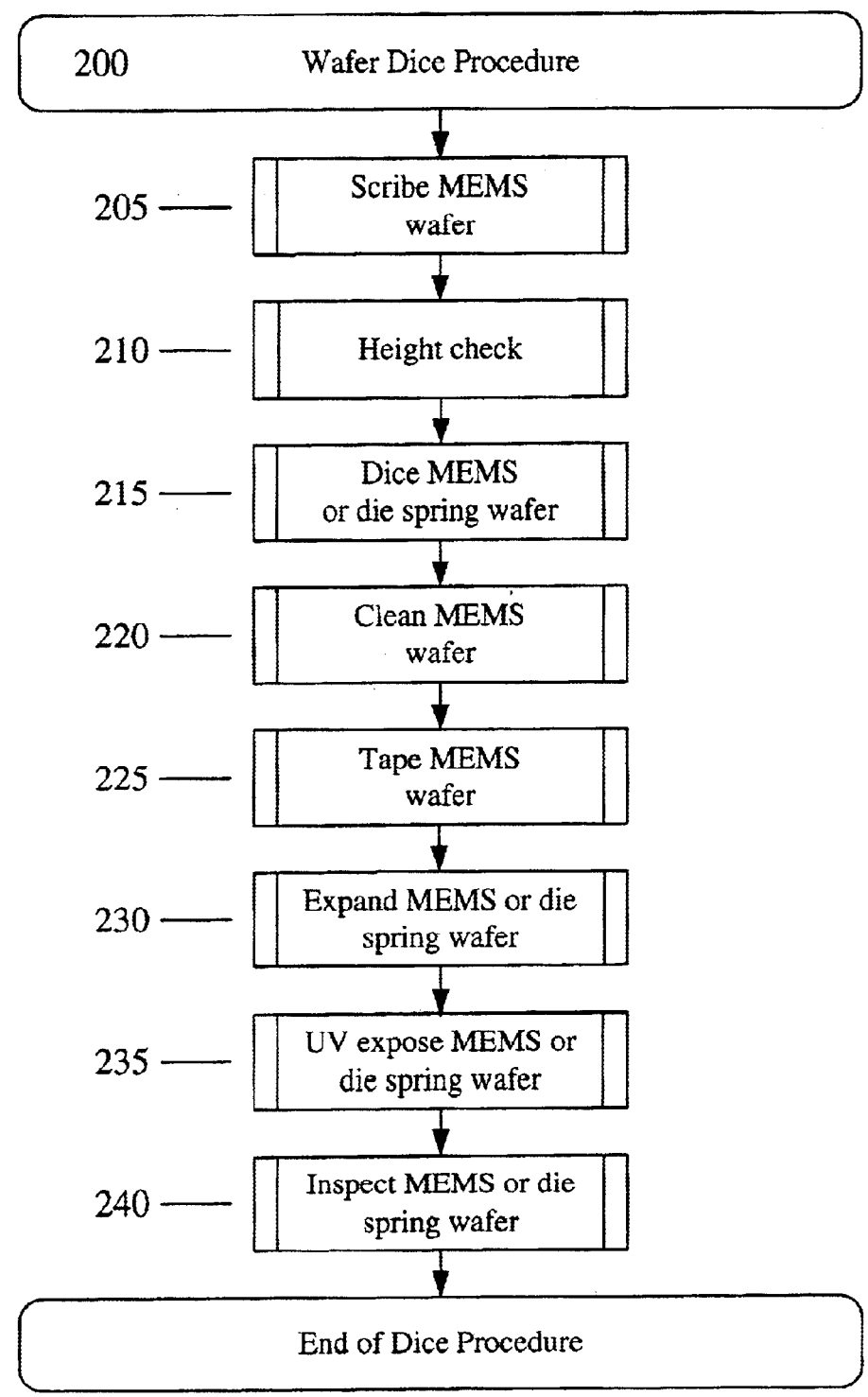
FIG. 2 shows in flow diagram form a simplified version of the dicing method of the present invention.

With the physical arrangement of FIG. 1 in mind, the process illustrated generally in FIG. 2 may be better appreciated. In particular, the overall dicing process 200 of the present invention includes, as shown at step 205, a scribing procedure (described in greater detail in connection with FIG. 3) for achieving backside alignment as discussed in connection with FIG. 1, followed by a height check step shown at 210 and a dicing procedure 215. The height check step 210 is intended to ensure that the dicing saw used during the dicing procedure 215 cuts only part way through the wafer, to avoid permitting either water or silica dust to contaminate the front side of the wafer 120.

At step 215, the partial dicing of the wafer is performed as explained in greater detail in connection with FIG. 4, using the alignment marks developed in connection with the scribe procedure of step 205. Following the backside dicing procedure of step 215, the wafer is cleaned and a stretchable media such as tape is applied as shown generally at steps 220 and 225, respectively, and described in greater detail in connection with FIG. 6.

Figure 5:
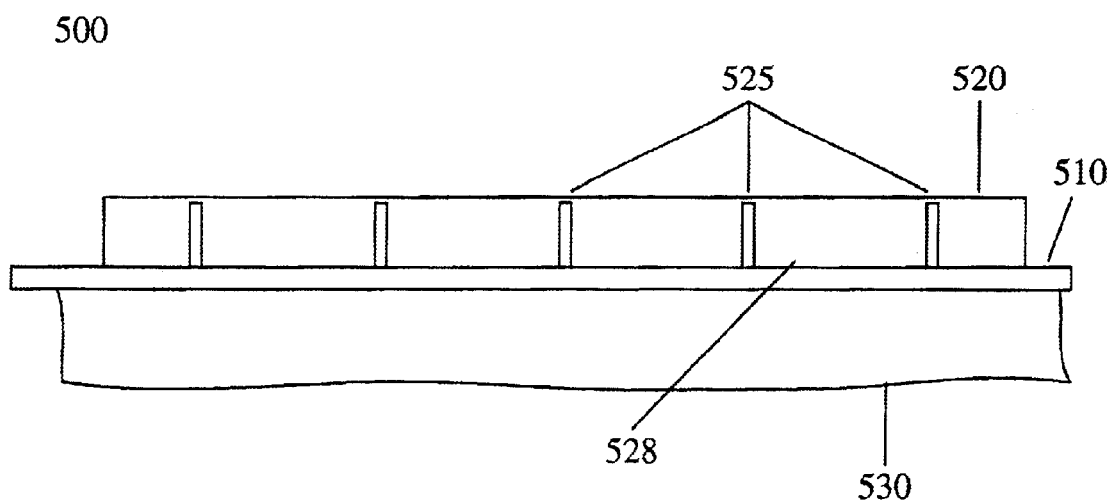
FIG. 5 illustrates the taper and carrier frame arrangement of the present invention.
Figure 6:
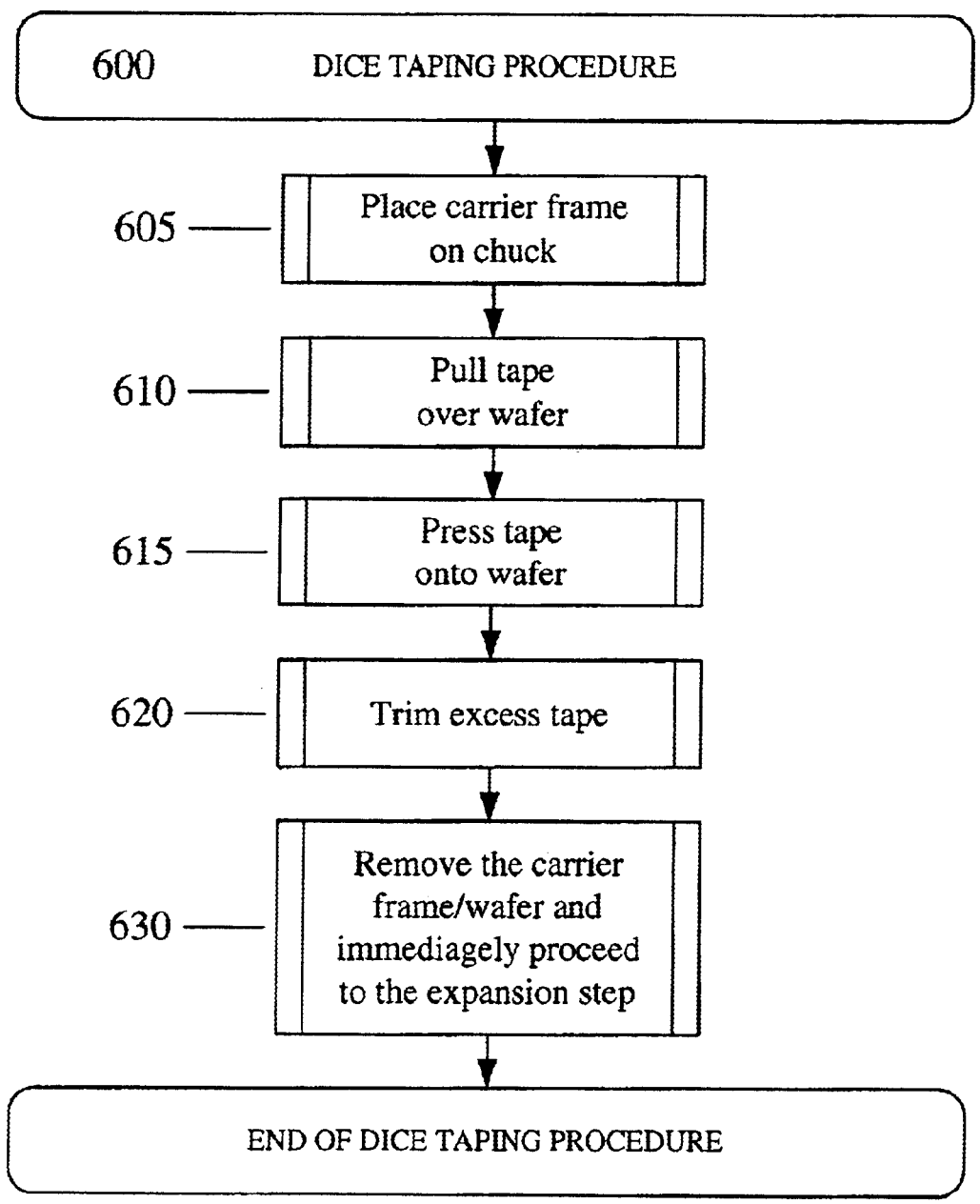
FIG. 6 shows in flow diagram form the taping procedure of the present invention.

Once the wafer 120 is taped at step 225, including mounting into a grip ring as shown in FIG. 5 in accordance with the invention, the stretchable tape is expanded as shown at step 230 of FIG. 2 and described in greater detail in connection with FIG. 6. The expansion procedure is typically but not necessarily followed by a UV exposure step 235, after which the individual die may be inspected as shown at 240. The dicing process of the invention need not include each step in every instance, and the particular steps are exemplary rather than limiting.

Figure 3:
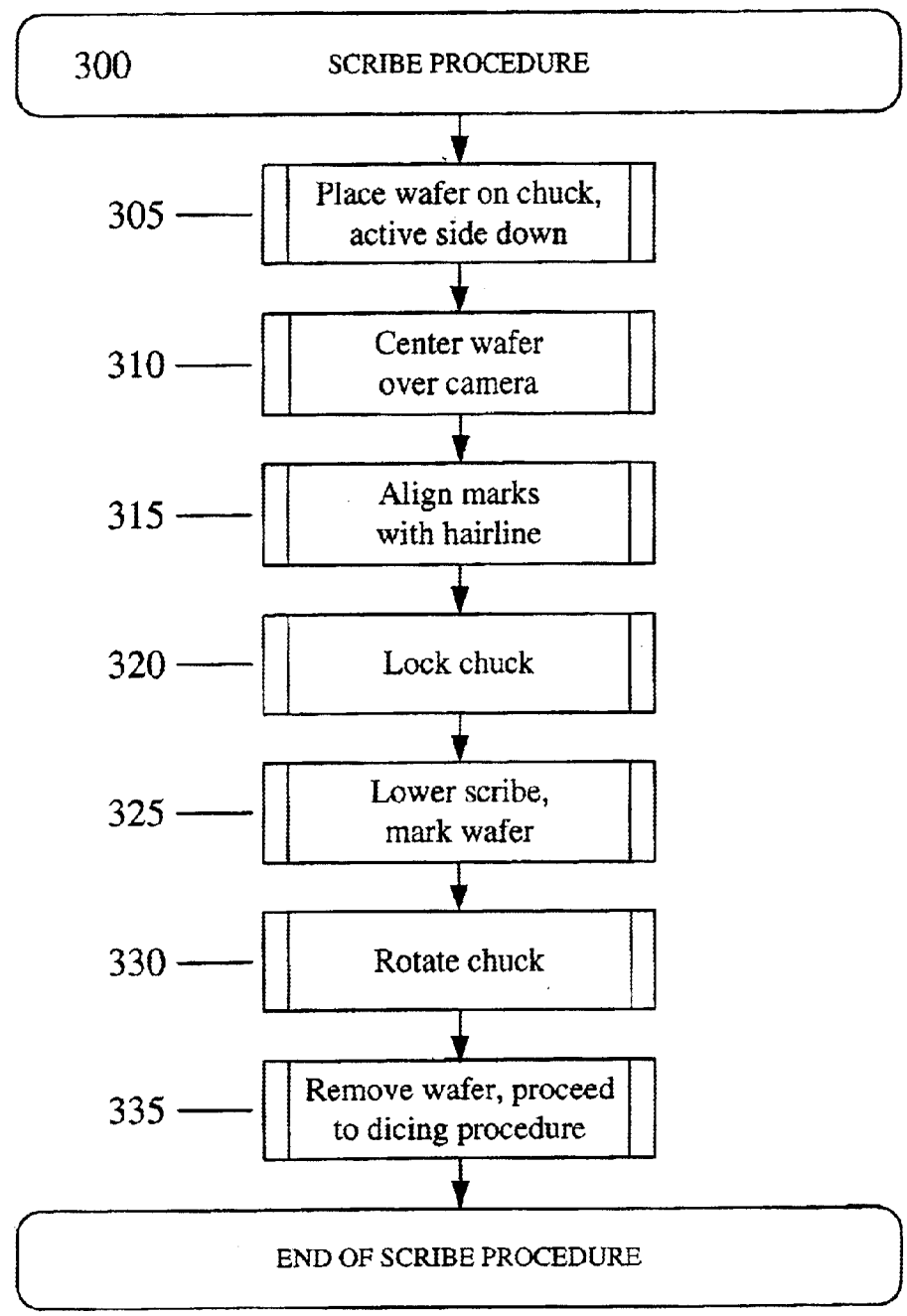
FIG. 3 shows in flow diagram form the scribe procedure of the present invention.

Referring next to FIG. 3, the scribe procedure [step 205 of FIG. 2] of the present invention may be better appreciated. The scribe procedure begins at step 300. At step 305, the wafer is placed with the active side down against the nominally flat chuck, which may for example be for six inch wafers, or for other wafer sizes and is described in greater detail in connection with FIG. 5B. A vacuum pump is then turned on to hold the wafer in place. Then, at step 310, the wafer is centered over the camera 140, which is then able to focus on die alignment marks on the active side of the wafer 120. The die alignment marks are visually aligned with a hairline at step 315 to ensure continuous alignment throughout the range of travel of the wafer as required for scribing.

Once the alignment has been established, the chuck is locked at step 320 to prevent further rotation, followed by lowering of the scribe onto the wafer at step 325 to mark the wafer as required. If additional scribe marks are required, as will generally but not always be the case, the table may then be rotated as shown at step 330, and the scribing process repeated until complete. In an exemplary arrangement, two perpendicular scribe marks are applied to the back of the wafer. Then at step 335, the wafer is removed for placement on the dicing machine, as discussed below.

Figure 4A:
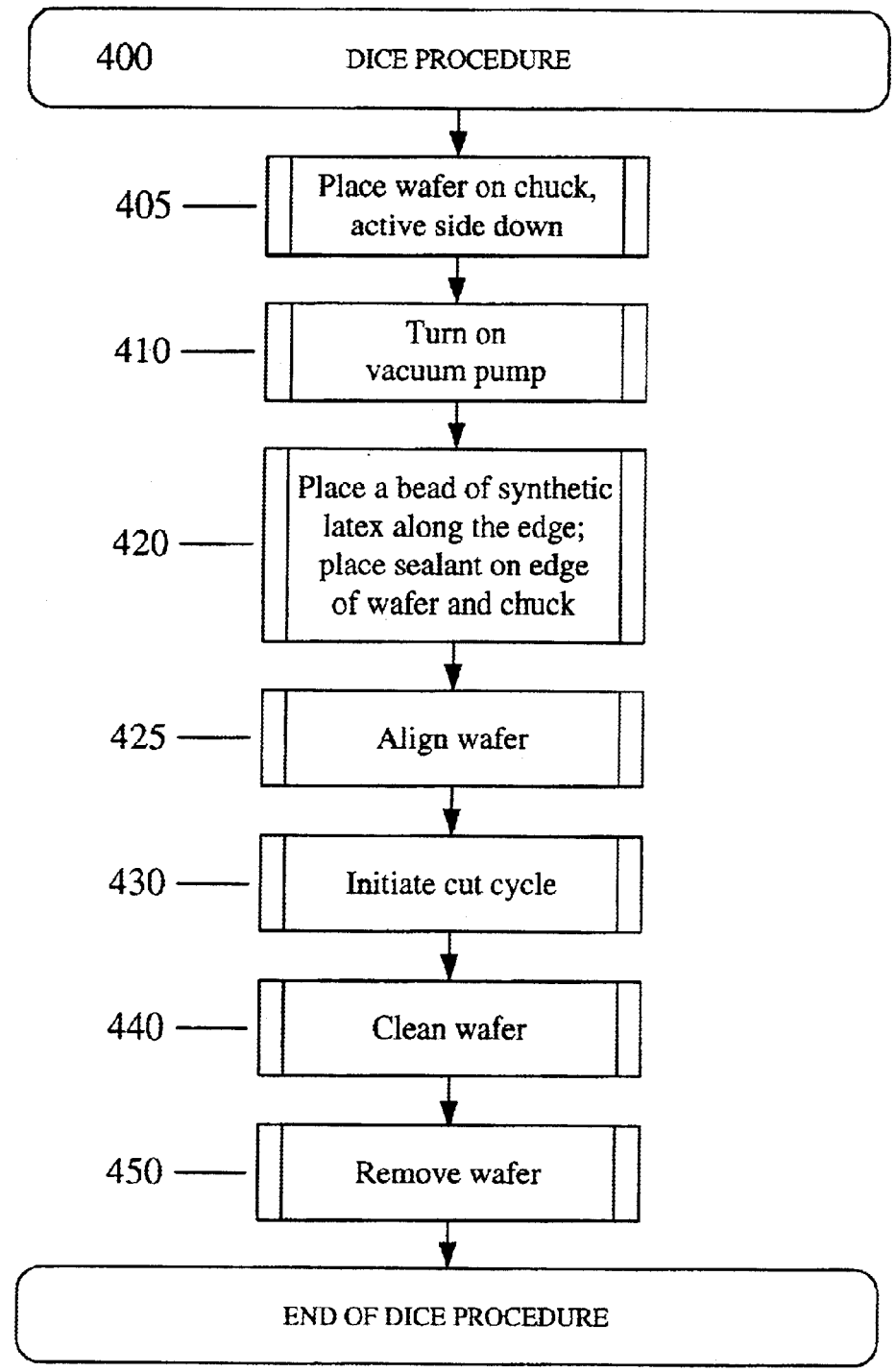
FIG. 4A shows in flow diagram form the dicing procedure of the present invention.
Figure 4B:
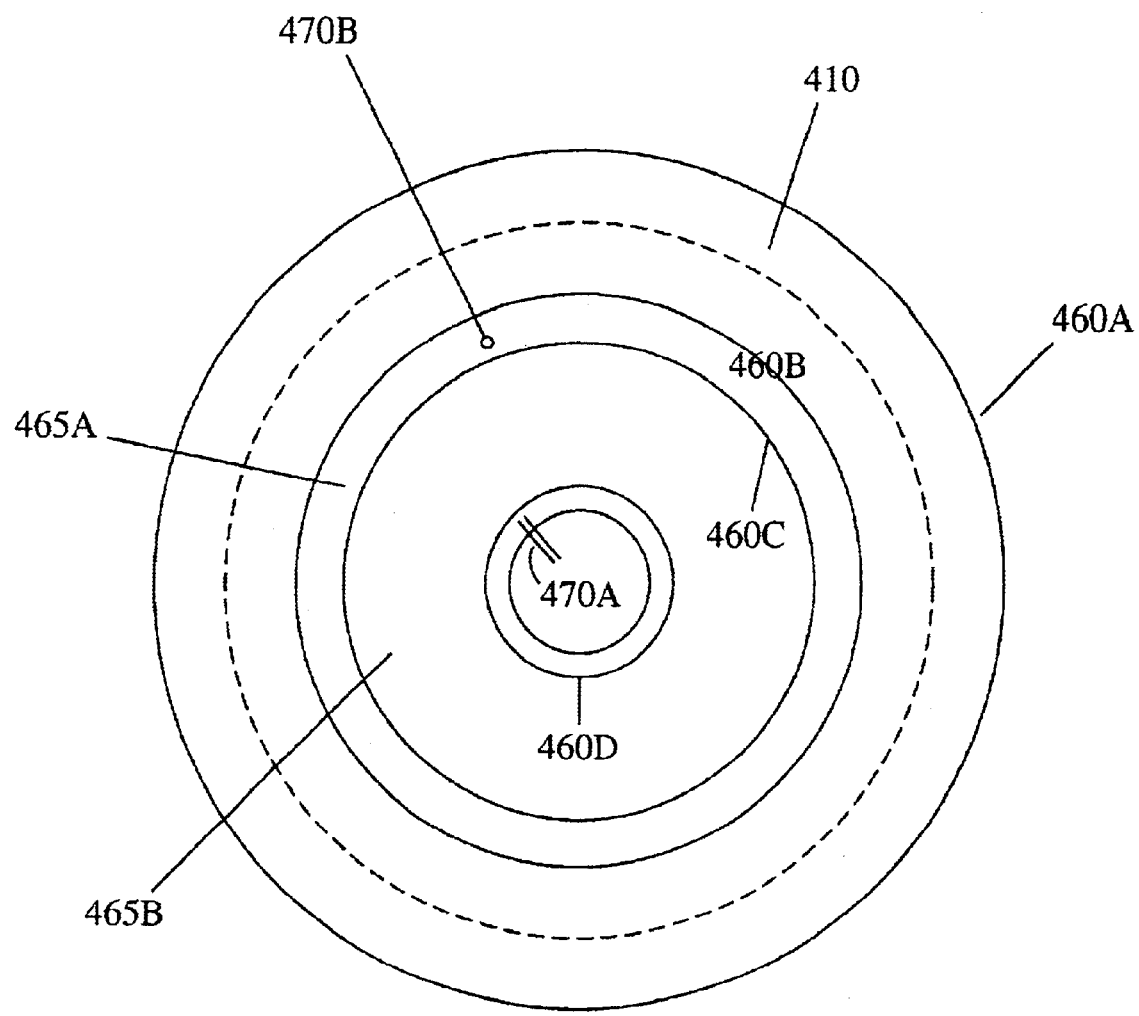
FIG. 4B shows a chuck design in accordance with the present invention, wherein at least two different gas pressures may be applied to different areas of the wafer, one in the center and a second in an outer portion.

Referring next to FIG. 4, the dicing procedure shown at step 215 of FIG. 2 may be better appreciated. The procedure starts at step 400, followed at step 405 by placing the wafer 120 face down into the chuck of a dicing saw, which may for example be a Disco Model DAD341. As noted previously, a plurality of pillars or stand-offs may be provided to support the wafer at a height greater than the height of the MEMS structures on the active surface of the wafer 120. The vacuum pump associated with the chuck is then turned on to hold the wafer in place, as shown at step 410. The chuck typically has a plurality of rings 460A–B for contacting the wafer as shown in FIG. 4B, with the areas 465A–B defined by the rings having separate access ports 470A–B for maintaining different gas pressures within those areas. In a presently preferred embodiment the center portion of the wafer is maintained at a gas pressure higher than the outer area, so that a positive differential exists between the center portion of the wafer and the outer ring of the wafer. This assists in preventing the intrusion of water into the active area of the wafer, since water which makes it onto the outside edge of the front surface is prevented by the differential gas pressure from reaching the interior area where the devices are. It will be appreciated that both the interior and exterior gas pressures may be a vacuum, as long as the interior portion is maintained at a gas pressure which is positive relative to the gas pressure of the exterior ring.

At step 420 a bead of sealant such as latex, wax or other suitable material is placed along the junction of the edge of the wafer and the chuck, to help to seal the active side of the wafer against contaminants caused by the dicing process. Following drying of the latex bead, the wafer is aligned at step 425 according to the scribe marks developed from FIG. 3. Then, at step 430, the cut cycle is initiated in a conventional manner. Such cut cycles are typically computer controlled, including establishing the parameters for the particular type of wafer, and continue until the cycle is complete.

Importantly, and as noted previously, the cuts made during the dicing procedure do not extend all the way through the wafer. Instead, for one typical embodiment, the cuts extend on the order of 580 $\mu$m+/–10 $\mu$m for a wafer having a total thickness on the order of 650 $\mu$m, although the exact depth of the cut and the range of tolerances can vary over a relatively wide margin. Stated differently, for wafers on the order of 650 μm total thickness, the cuts typically relieve all but about 80 μm of the wafer in an exemplary arrangement. The exact depth of the cut is determined by balancing the need to be able to handle the wafer during processing, where too deep a cut would cause the wafer to be too fragile, while at the same time providing enough relief of the wafer at the cuts so that the die can be separated in the expand procedure described hereinafter. In addition, none of the cuts should penetrate the wafer, to avoid contaminating the front surface. For at least some embodiments, relieving all but on the general order of 80 μm has proven to be successful at balancing these objectives, although the precise amount of material left may be varied. Once the die cutting cycle is complete, the wafer is cleaned at step 440.

Following the dicing procedure, the taping procedure begins. The taping procedure utilizes a carrier frames, as shown in FIG. 5, in combination with an Ultron UH-114-8 taper. In particular, the tape is stretched onto a carrier frame 505 to assist in supporting the wafer during further processing, as discussed in connection with FIG. 6.

With the foregoing arrangement in mind, the taping procedure begins at step 600 and continues with actuation of a vacuum pump to hold the wafer in place and the placement of the carrier frame around the chuck at step 605. The tape, which may for example be a high adhesion UV tape, is then pulled over the wafer 120. Then, at step 615, the tape is pressed onto the wafer to ensure uniform adhesion across the entirety of the wafer surface. At this point the tape will also extend past the carrier frame, in which case the excess tape can be trimmed at step 620. This leaves the wafer affixed to the tape and supported by the carrier frame. The carrier frame, with wafer attached, is then removed at step 630 for placement in the expander as discussed below.

Figure 7:
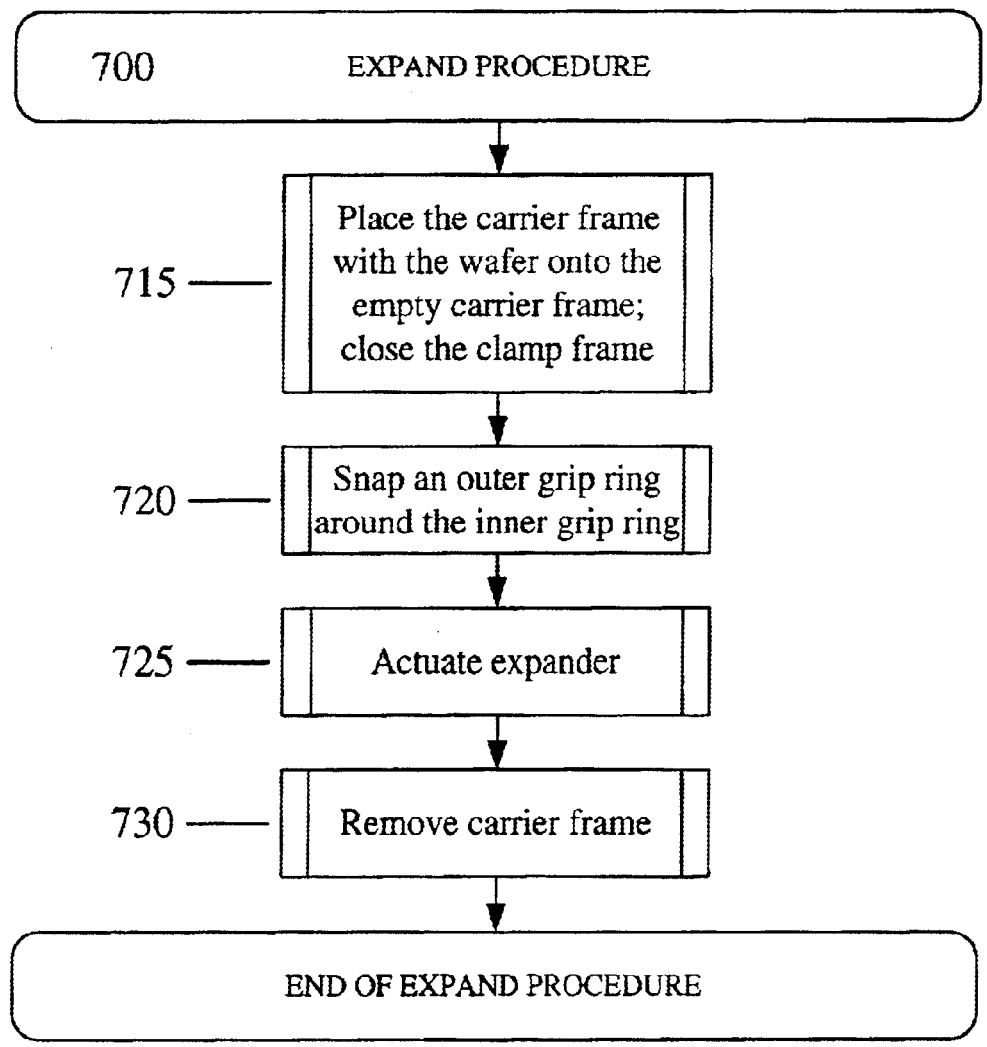
FIG. 7 shows in flow diagram form the expand procedure of the present invention.

As shown in FIG. 7, the expansion procedure involves use of a die matrix expander such as an Ultron UH130 or other similar device. The process begins at step 700 and continues at step 715, where the carrier frame with the wafer 120 attached is placed over an inner grip ring which resides on the expander. Then, at step 725, the expander is actuated to cause the tape to be stretched on the die frame expander. The stretching of the tape causes the wafer to break along the cuts made during the dicing procedure, resulting in the separation of the wafer into the individual die. An outer grip ring is then affixed to the tape inside the carrier frame, which ensures that the tape is maintained in the stretched position and that the individual die are maintained in a stable position. Once the expansion and separation are complete, the expander is returned to its original position and the carrier frame and grip ring, still with the individual die attached, is removed as shown at step 730. The grip ring and the portion of the tape (and attached die) can then be removed from the carrier frame for further processing.

As previously noted in connection with step 235, the wafer and tape are then exposed to UV to cure the tape, which causes the tape to lose the great majority of its adhesive quality, after which the individual die may be removed from the tape without risk of damage, and inspected.

It will therefore be appreciated that the foregoing describes a novel approach to separating a wafer into individual die without exposing the active side of the wafer to contaminants.

Various embodiments can comprise elements coupled together physically and/or functionally. The various embodiments of the structures and methods that are described above are illustrative only and do not limit the scope to the particular embodiments described, which are to be limited only by the following claims.

What is claimed is:

1. A method of separating a wafer into a plurality of die comprising the step of:

placing the wafer on a chuck with an active, front side down facing the chuck;

making a plurality of cuts or scribes in a back side of the wafer in accordance with a predetermined pattern, but without penetrating through to the active, front side of the wafer; and applying an expansive strain to the back side of the wafer to cause it to break along the predetermined pattern.

2. The method of claim 1, wherein placing the wafer on the chuck includes maintaining at least a gap between the chuck and the plurality of die on the active, front side of the wafer.

3. The method of claim 1, wherein placing the wafer on the chuck includes:

providing the chuck with a plurality of raised members for contacting the wafer, whereby the combination of the wafer and the raised members of the chuck establishes a plurality of chambers capable of having different gas pressures therein;

establishing a first gas pressure in a first, more central chamber;

establishing a second gas pressure in a second, outer chamber; and maintaining the first chamber at a differential gas pressure which is more positive than that of the second, outer chamber.

4. The method of claim 3, wherein both the first and second gas pressures are a vacuum.

5. The method of claim 3, further including applying a sealant to an outer contact edge of the wafer and the chuck.

6. The method of claim 1, wherein the step of making the plurality of cuts or scribes in the back side of the wafer includes, first scribing the wafer according to the predetermined pattern and then cutting the wafer according to the scribing.

7. The method of claim 1, wherein the predetermined pattern defines the separation of the wafer into the plurality of die.

8. The method of claim 1, wherein prior to the step of applying the expansive strain and after the step of making the plurality of cuts or scribes, the back side of the wafer is cleaned.

9. The method of claim 1, wherein applying the expansive strain to the back side of the wafer includes:

providing a grip ring larger in diameter than the wafer;

applying a stretchable tape to the grip ring;

mounting the wafer to the stretchable tape within the grip ring; and applying to the grip ring a strain which is transmitted through the tape to the wafer to cause the wafer to expand and separate along the cut or scribed predetermined pattern into the plurality of die.

* * * * *